United States Patent
Khare et al.

(10) Patent No.: US 6,576,932 B2
(45) Date of Patent: Jun. 10, 2003

(54) INCREASING THE BRIGHTNESS OF III-NITRIDE LIGHT EMITTING DEVICES

(75) Inventors: Reena Khare, Sunnyvale, CA (US); Werner K. Goetz, Palo Alto, CA (US); Michael D. Camras, Sunnyvale, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/797,770

(22) Filed: Mar. 1, 2001

(65) Prior Publication Data

US 2002/0121646 A1 Sep. 5, 2002

(51) Int. Cl.[7] .............................................. H01L 33/00
(52) U.S. Cl. ................... 257/103; 257/190; 257/615; 257/627; 257/94; 257/21; 257/14
(58) Field of Search ................................ 257/103, 190, 257/615, 627, 628, 94, 21, 96, 618, 14

(56) References Cited

U.S. PATENT DOCUMENTS

| | | | |
|---|---|---|---|
| 4,404,265 A | 9/1983 | Manasevit | 428/689 |
| 5,006,908 A | 4/1991 | Matsuoka et al. | 357/17 |
| 5,182,670 A | 1/1993 | Khan et al. | 359/359 |
| 5,278,433 A * | 1/1994 | Manabe et al. | 257/103 |
| 5,278,435 A | 1/1994 | Van Hove et al. | 257/184 |
| 5,279,808 A | 1/1994 | Xiao et al. | 423/411 |
| 5,321,713 A | 6/1994 | Khan et al. | 372/45 |
| 5,385,862 A | 1/1995 | Moustakas | 437/107 |
| 5,393,993 A | 2/1995 | Edmond et al. | 257/77 |
| 5,395,606 A | 3/1995 | Xiao et al. | 423/411 |
| 5,530,267 A | 6/1996 | Brandle, Jr. et al. | 257/76 |
| 5,585,648 A | 12/1996 | Tischler | 257/77 |
| 5,587,593 A | 12/1996 | Koide et al. | 257/94 |
| 5,598,014 A | 1/1997 | Barany et al. | 257/187 |
| 5,633,192 A | 5/1997 | Moustakas et al. | 438/46 |

(List continued on next page.)

FOREIGN PATENT DOCUMENTS

| | | |
|---|---|---|
| JP | 4-299876 | 10/1992 |
| JP | 4-323880 | 11/1992 |
| JP | 5-55631 | 3/1993 |
| JP | 6-291368 | 4/1993 |
| JP | 5-190903 | 7/1993 |
| JP | 11-74562 | 10/1997 |
| JP | 10098212 A * | 4/1998 |

OTHER PUBLICATIONS

Patent Abstracts of Japan, Pub. No. 11074562, Pub. Date Mar. 16, 1999, 2 pages.

(List continued on next page.)

Primary Examiner—Nathan J. Flynn
Assistant Examiner—Remmon R. Fordé
(74) Attorney, Agent, or Firm—Patent Law Group LLP; Rachel V. Leiterman

(57) ABSTRACT

LEDs employing a III-Nitride light emitting active region deposited on a base layer above a substrate show improved optical properties with the base layer grown on an intentionally misaligned substrate with a thickness greater than 3.5 $\mu$m. Improved brightness, improved quantum efficiency, and a reduction in the current at which maximum quantum efficiency occurs are among the improved optical properties resulting from use of a misaligned substrate and a thick base layer. Illustrative examples are given of misalignment angles in the range from 0.05° to 0.50°, and base layers in the range from 6.5 to 9.5 $\mu$m although larger values of both misalignment angle and base layer thickness can be used. In some cases, the use of thicker base layers provides sufficient structural support to allow the substrate to be removed from the device entirely.

33 Claims, 9 Drawing Sheets

U.S. PATENT DOCUMENTS

| | | | |
|---|---|---|---|
| 5,650,361 A | | 7/1997 | Radhakrishnan ............ 437/237 |
| 5,650,635 A | | 7/1997 | Razeghi et al. ................ 257/21 |
| 5,661,074 A | | 8/1997 | Tischler ........................ 438/32 |
| 5,668,395 A | | 9/1997 | Razeghi ....................... 257/441 |
| 5,670,798 A | | 9/1997 | Schetzina ..................... 257/96 |
| 5,677,538 A | | 10/1997 | Moustakas et al. ..... 250/370.12 |
| 5,679,965 A | | 10/1997 | Schetzina ................... 257/103 |
| 5,686,738 A | | 11/1997 | Moustakas .................. 257/103 |
| 5,725,674 A | | 3/1998 | Moustakas et al. ... 118/723 VE |
| 5,739,554 A | | 4/1998 | Edmond et al. ............ 257/103 |
| 5,751,013 A | * | 5/1998 | Kidoguchi et al. ........... 257/13 |
| 5,773,369 A | | 6/1998 | Hu et al. ..................... 438/746 |
| 5,779,924 A | | 7/1998 | Krames et al. ................ 216/24 |
| 5,793,062 A | | 8/1998 | Kish, Jr. et al. .............. 257/98 |
| 5,834,379 A | | 11/1998 | Shealy et al. ................ 438/767 |
| 5,847,397 A | | 12/1998 | Moustakas ............. 250/370.06 |
| 5,874,747 A | | 2/1999 | Redwing et al. .............. 257/77 |
| 5,880,485 A | | 3/1999 | Marx et al. .................... 257/94 |
| 5,886,368 A | | 3/1999 | Forbes et al. ................. 257/77 |
| 5,923,054 A | * | 7/1999 | Kobashi et al. ............. 257/103 |
| 5,926,726 A | | 7/1999 | Bour et al. .................. 438/507 |
| 5,926,740 A | | 7/1999 | Forbes et al. ............... 438/763 |
| 5,970,314 A | | 10/1999 | Okahisa et al. ............... 438/47 |
| 5,977,612 A | | 11/1999 | Bour et al. .................. 257/618 |
| 5,985,691 A | | 11/1999 | Basol et al. .................... 438/95 |
| 6,001,173 A | | 12/1999 | Bestwick et al. ............. 117/89 |
| 6,031,263 A | | 2/2000 | Forbes et al. ............... 257/315 |
| 6,046,464 A | | 4/2000 | Schetzina ..................... 257/96 |
| 6,051,849 A | | 4/2000 | Davis et al. ................. 257/103 |
| 6,064,078 A | | 5/2000 | Northrup et al. ............. 257/96 |
| 6,072,189 A | | 6/2000 | Duggan ....................... 257/14 |
| 6,072,196 A | * | 6/2000 | Sato ............................. 257/87 |
| 6,072,197 A | * | 6/2000 | Horino et al. .............. 257/103 |
| 6,083,812 A | | 7/2000 | Summerfelt ................ 438/481 |
| 6,086,673 A | | 7/2000 | Molnar ......................... 117/90 |
| 6,087,681 A | * | 7/2000 | Shakuda ..................... 257/103 |
| 6,133,589 A | | 10/2000 | Krames et al. ............. 257/103 |
| 6,165,812 A | * | 12/2000 | Ishibashi et al. .............. 438/46 |
| 6,222,203 B1 | * | 4/2001 | Ishibashi et al. .............. 257/88 |
| 6,355,497 B1 | * | 3/2002 | Romano et al. .............. 438/39 |

OTHER PUBLICATIONS

Patent Abstracts of Japan, Pub. No. 10215029, Pub. Date Nov. 8, 1998, 2 pages.

Translation From Japanese, Japanese Patent No. 2836687, Pub. Date Dec. 14, 1998, 6 pages.

Shuji Nakamura, "InGan Light–Emitting Diodes with Quantum–Well Structures," Materials Research Society Symposium, vol. 395, 1996, pp. 879–887.

Translation From Japanese, Unexamined Patent Application No. 11–74562, Disclosure Date Mar. 16, 1999, 3 pages.

Patent Abstracts of Japan, Publication No.: 04–299876.

Patent Abstracts of Japan, Publication No.: 04–323880.

Patent Abstracts of Japan, Publication No.: 05–190903 with English language translation of the corresponding Japanese patent application.

Patent Abstracts of Japan, Publication No.: 05–055631 with English language translation of the corresponding Japanese patent application.

* cited by examiner

INCREASING THE BRIGHTNESS OF III-NITRIDE LIGHT EMITTING DEVICES

BACKGROUND

1. Technical Field

The present invention relates to increasing the brightness of III-Nitride light emitting diodes.

2. Description of Related Art

Light emitting diodes ("LEDs") are a highly durable solid state source of light capable of achieving high brightness and having numerous applications including displays, illuminators, indicators, printers, and optical disk readers among others. Direct bandgap semiconductors are the materials of choice for fabrication of LEDs, which generate light from electricity. One important class of light emitting systems are based upon compound alloys of Group III atoms (particularly In, Ga, Al) and nitrogen N, typically abbreviated as "III-Nitrides." One family of III-Nitride compounds has the general composition $(In_xGa_{1-x})_yAl_{1-y}N$ where $0 \leq (x, y) \leq 1$. III-Nitrides are capable of emitting light that spans a large portion of the visible and near-ultraviolet electromagnetic spectrum including ultraviolet, blue, green, yellow and red wavelengths. Improving the brightness and other optical properties of LEDs is an important technological goal.

A portion of a typical prior art LED structure is depicted in FIG. 1. Other components of LEDs as known in the art (electrodes, window materials, etc.) are omitted for clarity.

An LED typically has one or more layers epitaxially deposited on a surface of a substrate prior to the formation of the light emitting active region. These epitaxial layers form a "base layer" that can have n-type conductivity. FIG. 1 depicts an example of a base layer having a GaN layer beneath an n-type GaN layer.

The light emitting active region in which radiative recombination of electrons and holes occurs is formed on top of the base layer, typically in the form of at least one quantum well although single and double heterostructures and homojunctions can also be used. Above the active region lie p-type conductive injection and confinement regions. Positive and negative contacts (omitted from FIG. 1) are also provided.

There remains a need for LEDs with improved optical performance including higher LED brightness and higher quantum efficiency.

SUMMARY

The present invention relates to structures for light emitting devices, particularly LEDs employing a III-Nitride light emitting active region deposited on an n-type conductive base layer. The substrate upon which the base layer is grown is cut intentionally misaligned from a main crystal plane. In addition to intentional substrate misalignment, base layers are employed that are thicker than 3.5 µm. In some embodiments of the present invention, the presence of a thick base layer provides sufficient mechanical support for the device such that the substrate can be removed entirely from the light emitting system, further increasing the performance of the device.

Examples are provided for the illustrative case of thick base layers deposited on a sapphire substrate misaligned from the c-axis. Misalignment angles are in the range from 0.05° to approximately 0.50. The present invention also employs base layers thicker than 3.5 µm, preferably in the range of 7 µm–10 µm. The combination of base layers>3.5 µm, grown on the misaligned substrates leads to surprisingly improved light emission.

BRIEF DESCRIPTION OF THE DRAWINGS

The drawings herein are not to scale.

DETAILED DESCRIPTION

The present invention relates to epitaxial layer thickness and crystal orientation for light emitting diodes ("LEDs") and, in particular to the substrate orientation and the base layer thickness between the substrate and the light emitting active region resulting in improved light emitting properties. The base layer is the layer or layers between the substrate and the active region, including layers close to the substrate, such as buffer or nucleation layers and layers close to the active region, such as transition layers. Specific examples are included in connection with LEDs based upon a double heterostructure multiple quantum well light emitting active region composed of indium gallium nitride (InGaN) deposited on an n-type conductive base layer on a sapphire substrate. These examples are intended to be illustrative only. The present invention is applicable to homojunctions, to single and double heterostructures and to single or multiple quantum well embodiments.

Pursuant to the present invention, the substrate is cut intentionally misaligned from a main crystal plane and thick base layers are grown on the misaligned substrates. Higher brightness and improved efficiency are among the improvements demonstrated in various embodiments by off-axis growth of a thick base layer. One embodiment is the growth of a thick n-type GaN base layer on an off-axis sapphire substrate.

Substrate Orientation and Base Layers

The substrates upon which LEDs can be fabricated include sapphire, SiC, GaN, GaAs, and GaP among others. Examples are included for the specific case of misaligned base layer growth on a sapphire substrate. However, sapphire is described herein as an illustrative example, not intended as a limitation on the various embodiments.

Figure 2:
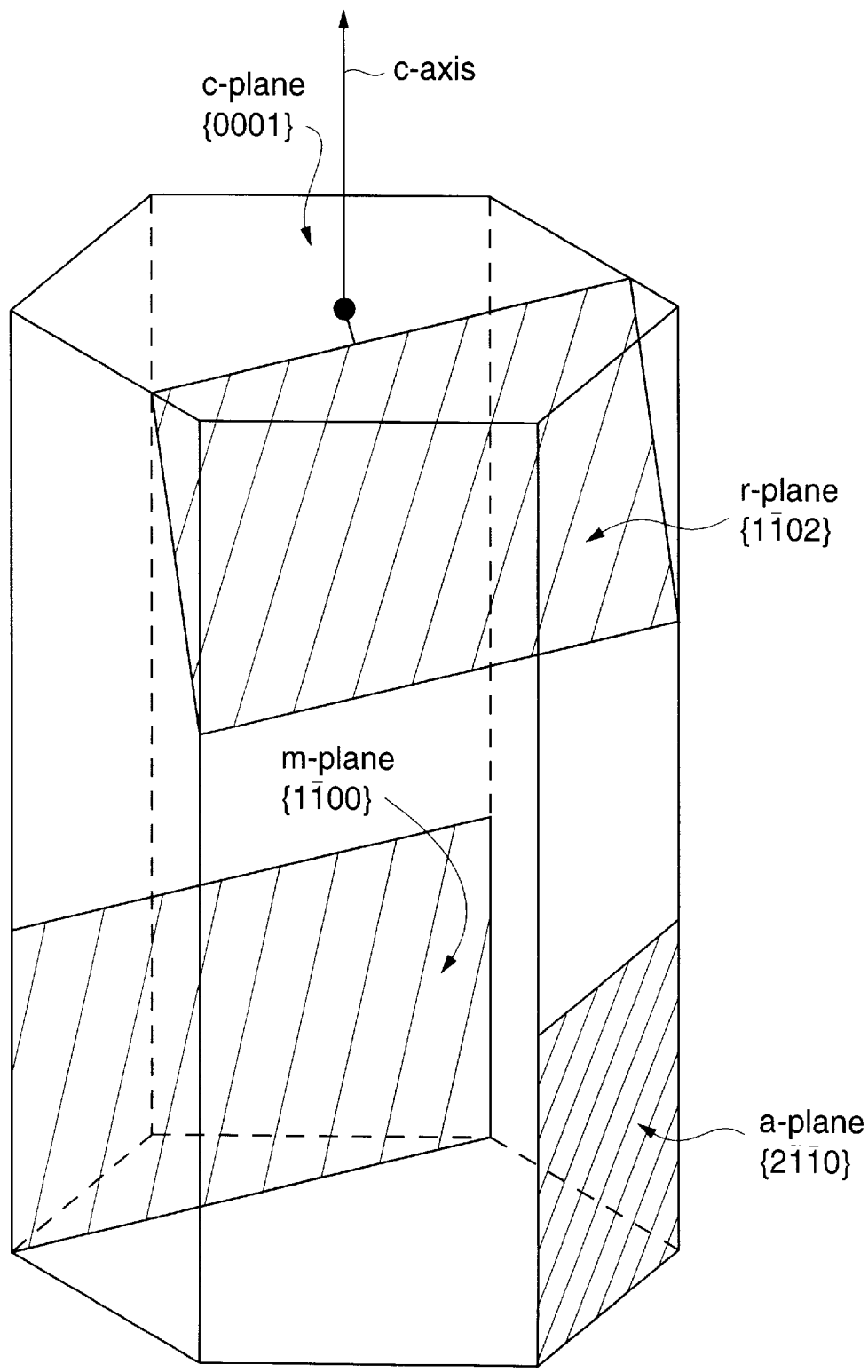
FIG. 2: Schematic depiction of a sapphire unit cell.

Sapphire, or $\alpha Al_2O_3$, has a hexagonal structure belonging to the space group R3c. The basic structure consists of hexagonal close-packed planes of oxygen intercalated with planes of aluminum atoms. FIG. 2 depicts the structure of a unit cell of the sapphire crystal and the planes commonly designated a, c, m and r. The {0001} plane is designated the "c-plane," and the "c-axis" is perpendicular to the c-plane. However, sapphire and III-Nitrides have a large lattice mismatch. To deposit III-Nitride layers on top of sapphire substrates a thin III-Nitride nucleation layer, also called a buffer layer, must be deposited first. The rest of the base layer then can be deposited. The base layer provides for carrier transport to the light emitting layer. The base layer typically comprises one or more III-Nitride materials (undoped, n-type or p-type).

We consider the example of an n-doped GaN base layer including doped, modestly doped, undoped and/or unintentionally doped GaN sublayers, recognizing that other materials can be employed for the base layer. A base layer with a graded doping can also be used. The doping level of the base layer can be lower in the direction towards the substrate and can be higher in the direction towards the active region, although the region close to the active region or the substrate may not follow this doping grade. Typical procedures for depositing n-type base layers, fabricating the MQW active region, and depositing p-type layers are described in several standard references including *Introduction to Nitride Semiconductor Blue Lasers and Light Emitting Diodes*, Eds. S. Nakamura and S. F. Chichibu, (Taylor & Francis, 2000) and "InGaN Light emitting Diodes with Quantum-Well Structures" by S. Nakamura, appearing in *Materials Research Society Symposium Proceedings, Vol. 395, Gallium Nitride and Related Materials*, Eds. F. A. Ponce, R. D. Dupuis, S. Nakamura, J. A. Edmond (Materials Research Society, 1996), pp. 879–887.

Conventional fabrication techniques for LEDs involve the growth of one or more layers collectively comprising a base layer and providing a transition from the substrate to the active region. In prior art LEDs employing a sapphire substrate, base layers are conventionally grown on the sapphire substrate along the c-axis, typically called "on-axis" or "aligned" growth. "On-axis" emphasizes that the sapphire crystal is cut as precisely as is feasible along the c crystallographic plane (or other main crystal plane) and the base layer is grown substantially perpendicular to the c-axis.

In the present invention, the sapphire (or other) substrate upon which the base layer is grown is cut not precisely perpendicular to the c-axis depicted in FIG. 2 (or other main crystallographic axis) but is inclined at a small deviation from perpendicularity. The substrate surface on which the base layer is deposited pursuant to these embodiments is thus not precisely the c-plane depicted in FIG. 2. We use "misalignment" or "tilt angle" to denote the angle between the normal to the growth plane and the c-axis. Misaligned, off-axis growth thus denotes growth of a base layer on a substrate surface that is misaligned from such a main crystal plane.

The direction of misalignment with respect to a designated crystallographic axis can also be specified. For the examples considered herein of growth on a sapphire substrate, it is convenient to indicate the direction of misalignment of the c-axis towards the m-plane as "m-plane tilt," or towards the a-plane as "a-plane tilt." However, off-axis growth planes can have any orientation, not limited to purely m-plane or purely a-plane tilts. Off-axis growth for other substrates can be defined in a completely analogous manner in terms of the direction of the misalignment with respect to a main crystallographic axis.

Figure 3A:
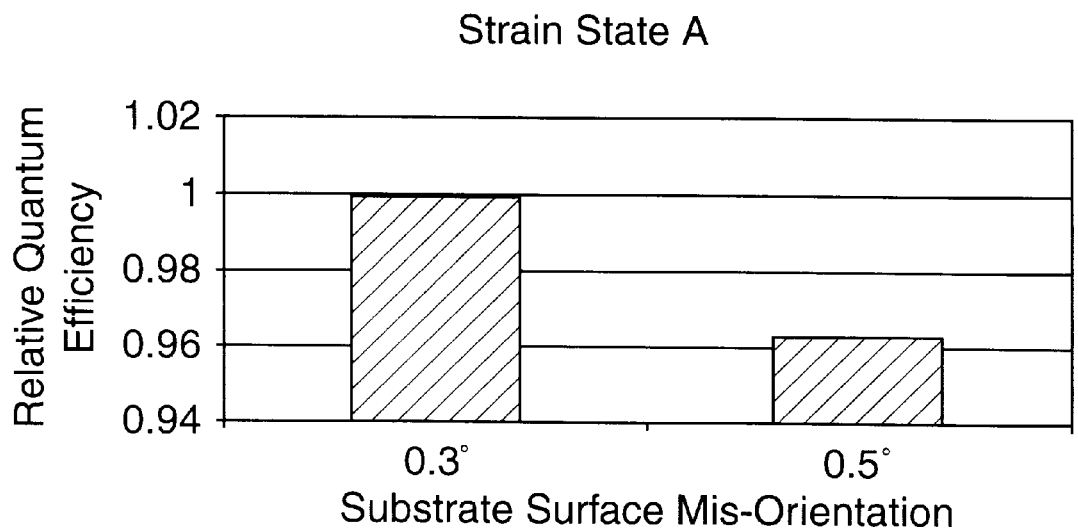
FIGS. 3a and 3b: Relative light emitting efficiency for LEDs grown on mis-oriented c-plane sapphire substrates with mis-orientation angles of 0.3 and 0.5°. Data are shown for LED structures with base layers having strain state A (a) and B (b).
Figure 3B:
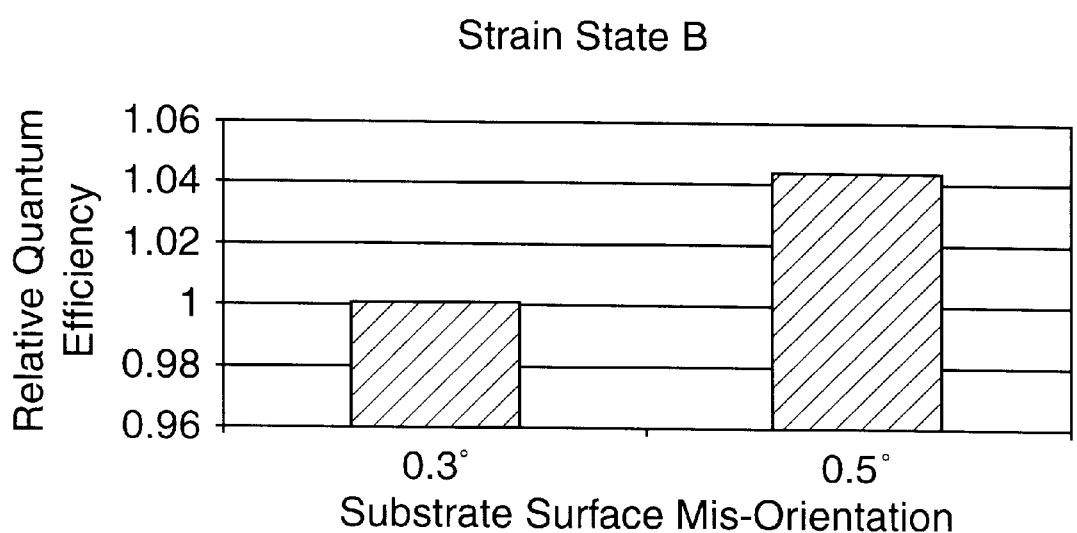

Experiments suggest that optical performance improves as tilt angles larger than about 0.05° are used in combination with thick base layers. In general, it is found that growth of a thick base layer on a substrate with a misalignment of more than 0.05° improves LED brightness and other optical properties without a clear upper limit to the misalignment angle. It is possible that the tilt angle that yields LEDs with improved brightness depends on the strain state of the III-Nitride base layers. Strain denotes the deviation of the lattice constants of an epitaxial layer with respect to bulk crystal. III-Nitride layers grown on c-plane sapphire substrates are generally "in compression" (the lateral lattice constant is smaller than for a bulk crystal). However, the introduction of Si into a III-Nitride crystal can reduce the degree of compression and, at high doping levels, cause the crystal to be "in tension" (the lateral lattice constant is larger than for a bulk crystal). In FIG. 3 relative light output efficiency is shown for LEDs that have a strain state "A" and a strain state "B" (3a and 3b, respectively). While for strain state "A" a mis-alignment angle of 0.3° is favorable, for strain state "B" a mis-alignment angle of 0.5° gives improved brightness. Strain state "B" denotes more tension with respect to strain state "A" and was accomplished by higher Si doping. It is expected that for even higher Si doping concentration and or thicker base layers tilt angles>0.5° can be favorable and improved brightness has been observed for a tilt angle of 1°.

Under a certain set of growth conditions on a lattice mismatched substrate, the layer being grown may crack. The cracking limit is the maximum thickness that the layer (of a particular doping) can be grown without significant cracking, such that device performance is not adversely affected. There can be a trade-off between doping and thickness, the lighter the doping, the thicker the layer can be grown before it cracks.

M-plane, a-plane and intermediate direction tilts from the c-plane have been investigated with respect to base layer growth on sapphire. No significant variation in optical performance has been observed with variation in tilt direction to the accuracy of the measurements reported herein. Most tilt angles given herein are m-plane tilts from the c-plane. Tilt angles less than 0.05° are not significantly different from on-axis. Thus, "on-axis" is used herein to indicate tilt angles from 0 to 0.05° in any direction.

In the fabrication of light emitting devices on a substrate, a base layer comprising one or more constituent layers is typically grown on the substrate as a transition region between the substrate the light emitting active region. Typically, Metal-Organic Chemical Vapor Deposition ("MOCVD") is used to grow the sublayers comprising the base layer, although other deposition techniques can be used and are within the scope of the present invention. To be concrete in our discussion, we describe the particular example of growth of a base layer on a sapphire substrate, not intending thereby to exclude other substrates such as SiC, GaN, GaAs, and GaP among others.

Figure 4:
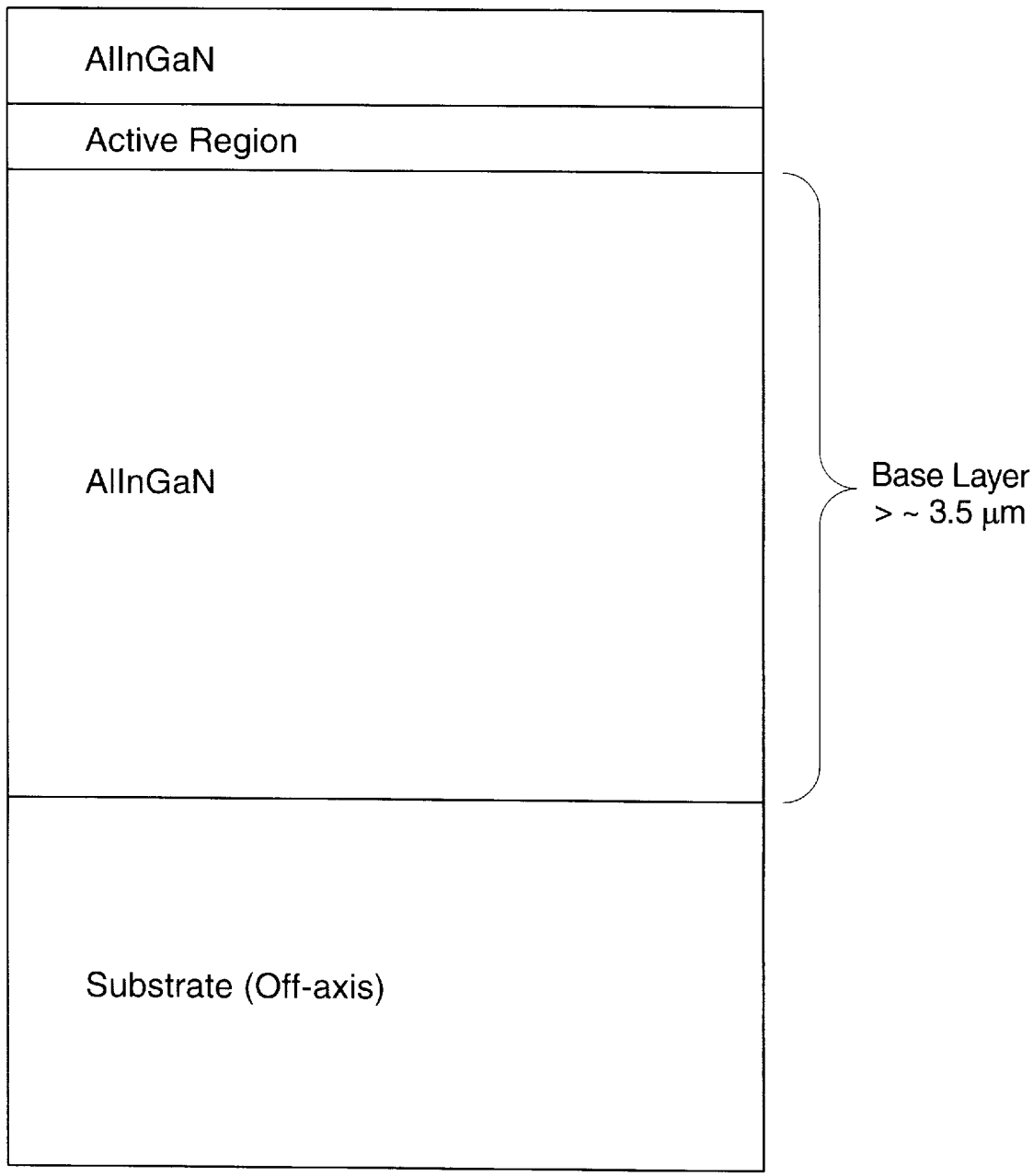
FIG. 4: Schematic cross-sectional depiction of a portion of a LED layered structure pursuant to an embodiment of the present invention.

FIG. 4 is a schematic depiction of the cross-section of a portion of an LED device pursuant to an embodiment of the present invention. The device comprises a base layer of AlInGaN grown above an off-axis substrate to a thickness greater than about 3.5 $\mu$m. The first layer or region of the base layer is typically a buffer layer or nucleation layer (not shown). The last layer or region of the base layer can be a transition layer (not shown), that can provide a transition between the previous base layer growth and the active region. An active region for emitting light is grown above the base layer. The active region can be a homojunction, a single or a double heterostructure, or a single or multiple quantum well structure. An AlInGaN confinement layer is grown above the active region. The AlInGaN layers can be any composition of AlInGaN, including GaN, AlGaN, and InGaN, and can be n-type, p-type, undoped, or have a graded doping profile. The two AlInGaN layers can have different compositions from one another. The AlInGaN base layer can have a graded doping level that generally decreases in the direction towards the substrate and increases in the direction towards the active region, although as previously mentioned, other regions or layers close to the substrate or close to the active region may not follow this doping grade. The AlInGaN base layer can be composed of sublayers including a sublayer that is closer to the substrate and a sublayer that is closer to the active region such that the sublayer closer to the active region is more heavily doped than the sublayer closer to the substrate. The sublayer closer to the active region can be more heavily doped n-type or p-type than the sublayer closer to the substrate. Examples of sublayer dopings include: a sublayer closer to the active region more heavily doped n-type than a n-type sublayer closer to the substrate; a sublayer closer to the active region more heavily p-type than a p-type sublayer closer to the substrate; a sublayer closer to the active region more heavily doped p-type than a n-type sublayer closer to the substrate; and a sublayer closer to the active region more heavily doped n-type than a p-type sublayer closer to the substrate. P-type base layers between the substrate and the active region can occur, for example, in tunnel junction devices and in n-up devices that that have an opposite polarity electric field than the more conventional p-up devices. All of these devices are included within the scope of the present invention.

Figure 5:
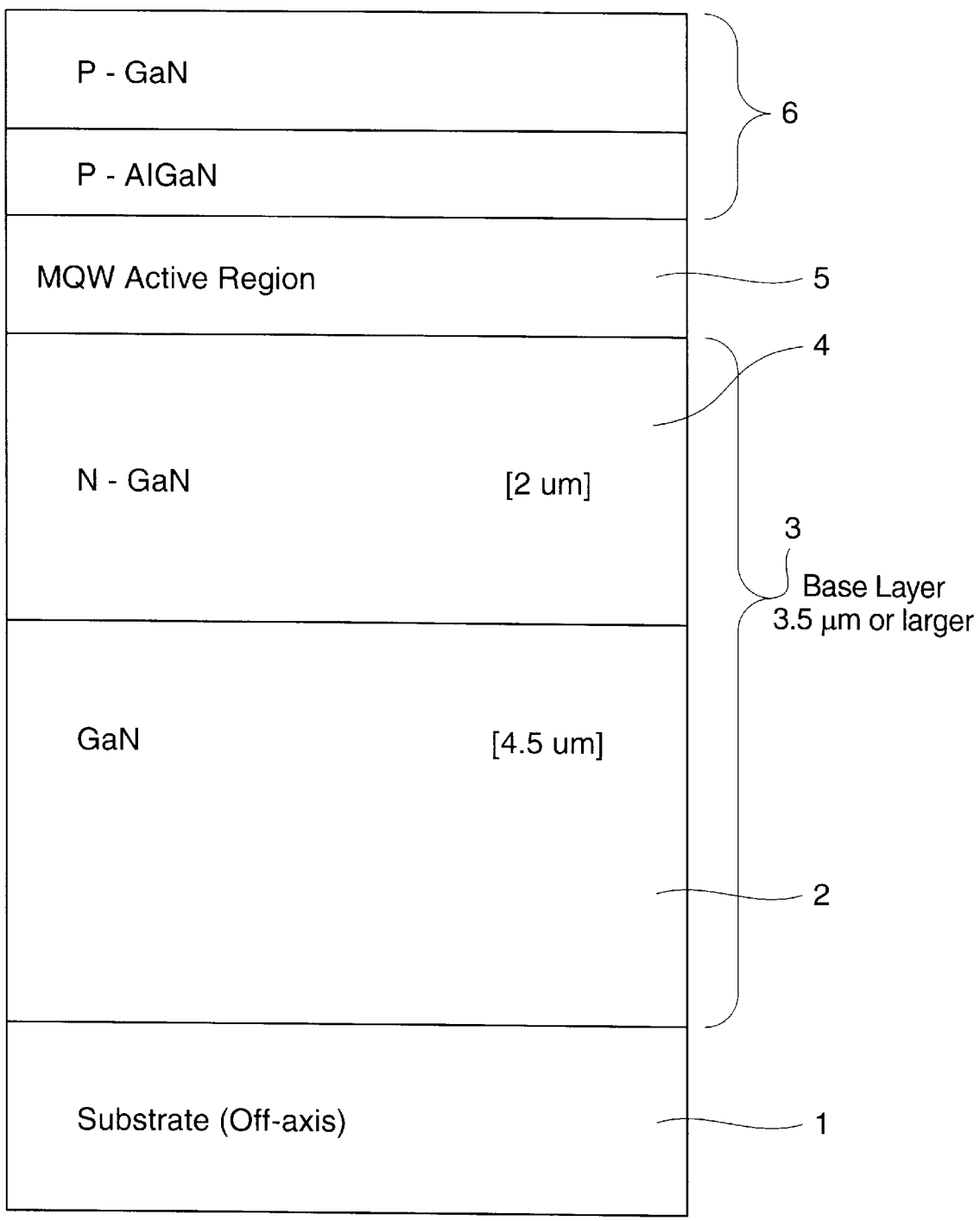
FIG. 5: Schematic cross-sectional depiction of a portion of a LED layered structure pursuant to another embodiment of the present invention.

FIG. 5, one embodiment of the present invention, is a schematic depiction of the cross-section of a portion of an LED device showing a sapphire substrate 1 and the base layer 3 between the substrate and the light emitting active region 5. A base layer of n-type GaN 2 comprising a sublayer of the base layer 3 deposited on a buffer layer (not shown) on a sapphire substrate 1 misaligned from a main crystal plane. The buffer layer growth of nitride on sapphire (on-axis or off-axis) is recognized not to be precisely epitaxial due to the lattice mismatch. Rather, the initial stages in the growth of nitride on sapphire seem to proceed by solid phase crystallization from an amorphous phase of GaN as deposited on the sapphire. Subsequent base layers are deposited epitaxially on the buffer layer. In one embodiment described below the base layers are n-type GaN. If no special precautions are taken, deposited GaN tends to be n-type conductive. That is, if GaN is deposited without the introduction of specific dopants, n-type material typically results. This "unintentional" n-type doping may result from the incorporation of n-type impurities (for example, silicon and oxygen) from background gases into the GaN. However, n-doped GaN can also be used as base sublayer 2 in which modest amounts of dopants are specifically introduced into the GaN. Specific introduction of modest amounts of dopant can result in a more controlled, reproducible LED structure than unintentional doping. In the examples presented herein, sublayer 2 is unintentionally doped n-type.

In practice, doping levels have an effect on the thickness to which sublayer 2 can be grown before the cracking limit is reached. We use the term "lightly doped GaN" to indicate a GaN layer that is unintentionally or modestly doped having a doping level sufficiently low, typically less than about $5 \times 10^8$ dopant atoms per cubic centimeter. Using a lightly doped sublayer allows the base layer to be grown to the desired thickness without reaching the cracking limit. "Lightly doped" applied to material other than GaN used for sublayer 2 likewise denotes doping levels that allow growth to the desired thickness before the cracking level is reached. In one embodiment, the lightly doped GaN 2 sublayer is 4.5 $\mu$m thick.

In this embodiment, a sublayer of n-doped GaN 4 is grown over the lightly doped GaN 2. In this embodiment, n-doped GaN 4 is 2 $\mu$m thick. N-GaN 4 is typically doped to a concentration in the range of approximately $10^{18}$–$10^{20}$ dopant atoms per cubic centimeter. In this embodiment, n-doped GaN 4 has a dopant concentration on the order of approximately $10^{19}$ dopant atoms per cubic centimeter. A Si dopant is used for the examples presented herein but is not a limitation on the scope of the present invention. Si, Ge, Sn, O are among the dopant atoms used to dope the III-Nitrides n-type. P-type dopants include Mg, Zn, Be, C, and Cd. Another layer, layers, or regions of the base layer 3 may precede the active region 5. This transition layer or region (not shown) is part of base layer 3 and can be lightly doped and serves as a transition between the previous part of the base layer and the active region 5.

Above the base layer 3 lies the active light emitting region 5. In some embodiments a multi-quantum-well ("MQW") comprising several quantum well layers separated by barrier layers of higher bandgap material. For InGaN quantum wells, typical barrier layers include higher bandgap InGaN, GaN, AlGaN, and AlInGaN. Although the present invention is described in terms of InGaN MQWs on a sapphire substrate with n-type GaN buffer regions, the present invention is not inherently limited to this LED structure.

Layers of p-type conductivity known as "confinement layers" and "injection layers" lie opposite the active region from the n-type base layer, depicted as 6 in FIG. 4. Typical materials, dimensions and dopant concentrations for the p-layers are known in the art and given in the references previously cited and can be, for example, 100–1000 Å of p-type $Al_xGa_{l-x}N$ (0<x<0.25) followed by 100–3000 Å of p-type GaN. A more heavily doped p-type layer may be formed above the P-GaN to ensure good ohmic contact of the p-electrode.

Figure 1:
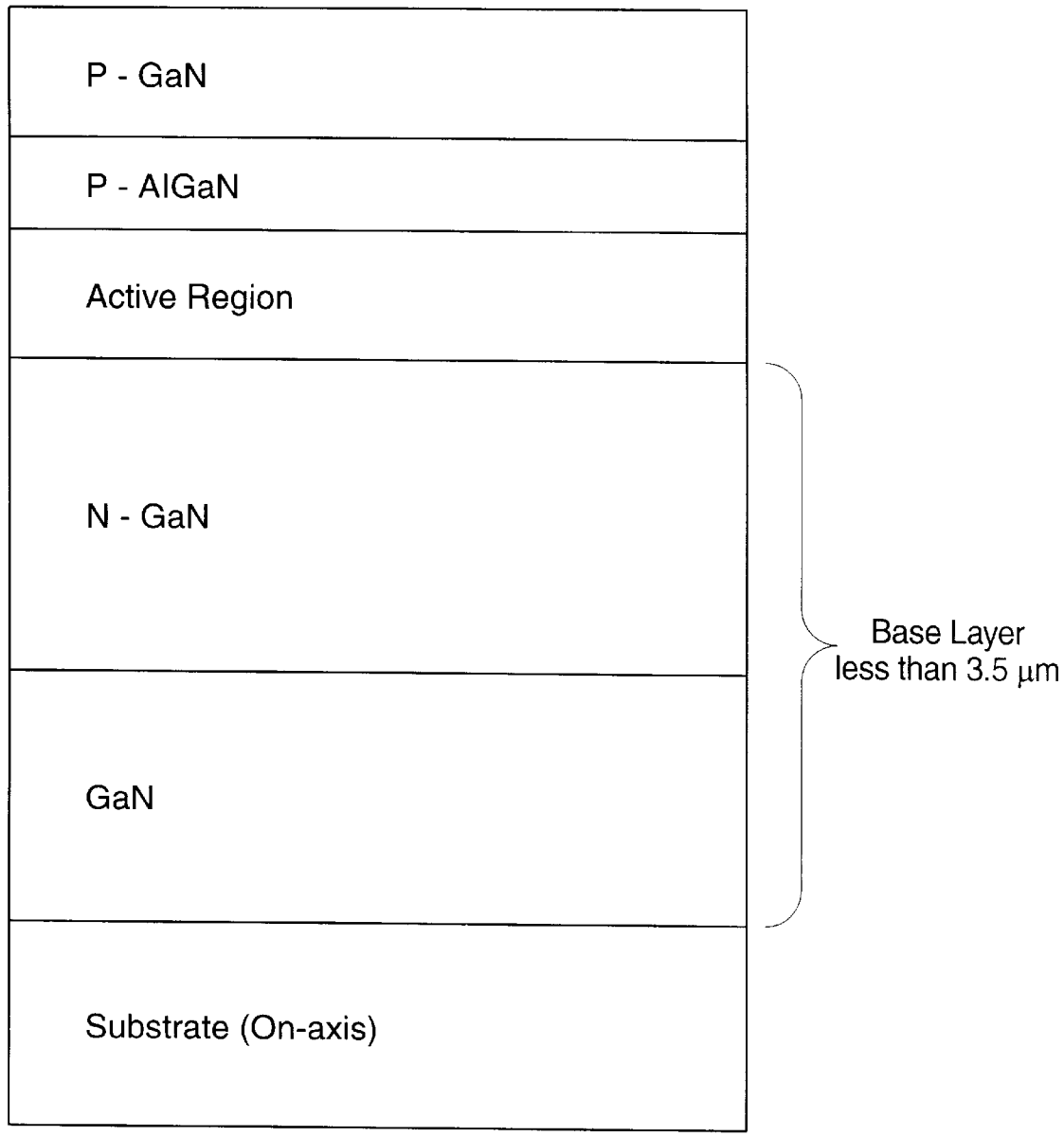
FIG. 1: Schematic cross-sectional depiction of a portion of a prior art LED layered structure.

In typical prior art LEDs as depicted in FIG. 1, the base layers are grown on on-axis substrates with a total thickness of less than 3.5 $\mu$m. One embodiment of the present invention, FIG. 5 shows the base layer 3, grown on off-axis substrates, to be thicker than that of FIG. 1. That is, the present invention uses base layers 3 having a thickness greater than about 3.5 $\mu$m grown on off-axis substrates. A preferred thickness of base layer 3 is from approximately 6.5 to approximately 9.5 $\mu$m grown on off-axis substrates. Improved brightness is one favorable result from the use of thick base layers 3 in combination with off-axis epitaxial growth. For economy of language, we refer to "thin" and "thick" base layers to indicate the general ranges below 3.5 $\mu$m for "thin" and above 3.5 $\mu$m for "thick."

The examples presented herein maintain the N-GaN layer 4 at a thickness of about 2 $\mu$m and cause the base layer 3 to thicken by causing the lightly doped GaN layer 2 to thicken. This is illustrative only and the thickening of the base layer described herein can be achieved by thickening any or any combination of sublayers comprising the base layer.

Although base layers 3 thicker than about 3.5 $\mu$m and, advantageously, in the range from approximately 6.5 $\mu$m to about 9.5 $\mu$m grown on off-axis substrates give adequate results in the practice of the present invention, considerably thicker layers up to approximately 200 $\mu$m grown off-axis are also feasible. Brightness increases with increasing thickness of the off-axis grown base layer and the present invention has no upper limit on thickness. However, the increased thickness of the overall LED structure tends to increase manufacturing complexities, for example throughput and device singulation.

Substrate Removal

The primary function of the substrate is to provide a platform upon which the various layers of the complete light emitting device can be fabricated. The substrate thus provides mechanical strength and stability during fabrication and operation. However, during operation of the light emitting device, the optical properties of the substrate may interfere with effective light extraction (among other properties) and thus hinder device performance. The thick base layers used herein provide, in some cases, sufficient mechanical stability to allow separation of the substrate from the remainder of the device following fabrication of the thick base layers.

EXAMPLES

Several examples compare brightness and other optical properties of the LED for various off-axis tilt angles and for various thicknesses of n-type base layers. The data relates to InGaN MQW LEDs as generally depicted in FIG. 5.

Figure 6:
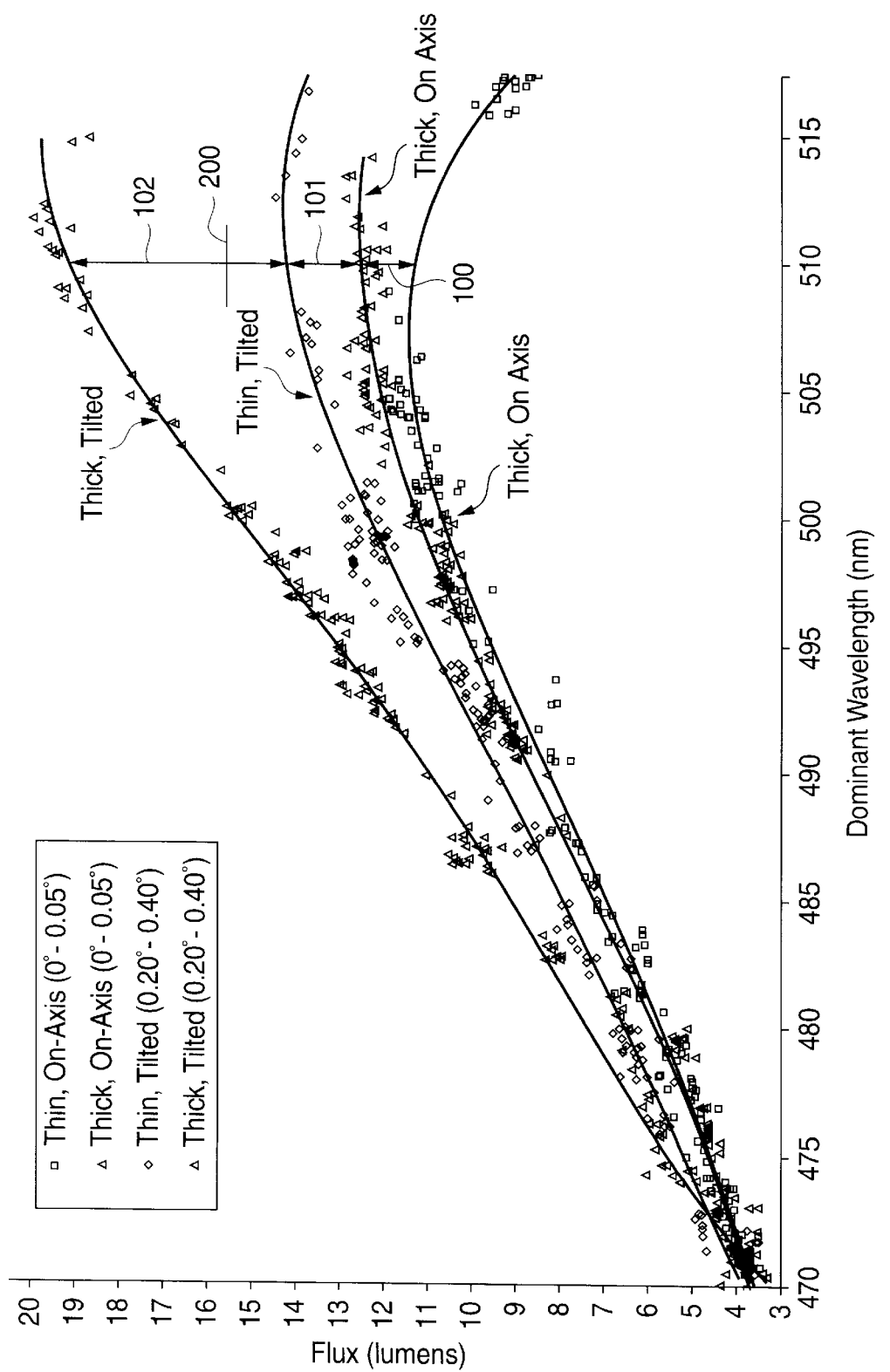
FIG. 6: Brightness as a function of dominant wavelength for LEDs having thin (3.5 µm) and thick (6.5 µm) base layers grown on-axis (tilt angle less than 0.05°) and off-axis (tilt angle in the range from about 0.20° to about 0.40°).

Several batches of LEDs were fabricated with different dominant emission wavelengths. FIG. 6 depicts the LED brightness in lumens as a function of this dominant wavelength for LED's having thin and thick base layers. "Thin" base layers are about 3.5 $\mu$m thick while "thick" base layers are about 6.5 $\mu$m thick in FIG. 6. Surprisingly, the improved light emission achieved by using thick and off-axis base layers in combination markedly exceeds the sum of the individual improvements from each effect considered separately. For example, at approximately 510 nm, FIG. 6 depicts the improvement obtained from thin on-axis to thick on-axis as segment 100. The improvement achieved from thin on-axis to thin off-axis is depicted as 100+101. The improvement obtained by the combination of thick and off-axis base layers is 100+101+102, which markedly exceeds the sum of contributions from thick and off-axis effects considered separately (100+101+100=flux level 200). Thus, the combination of thick base layer together with growth on a on a off-axis substrate achieves an improvement in light emission that unexpectedly and clearly exceeds the sum of its individual parts.

Figure 7:
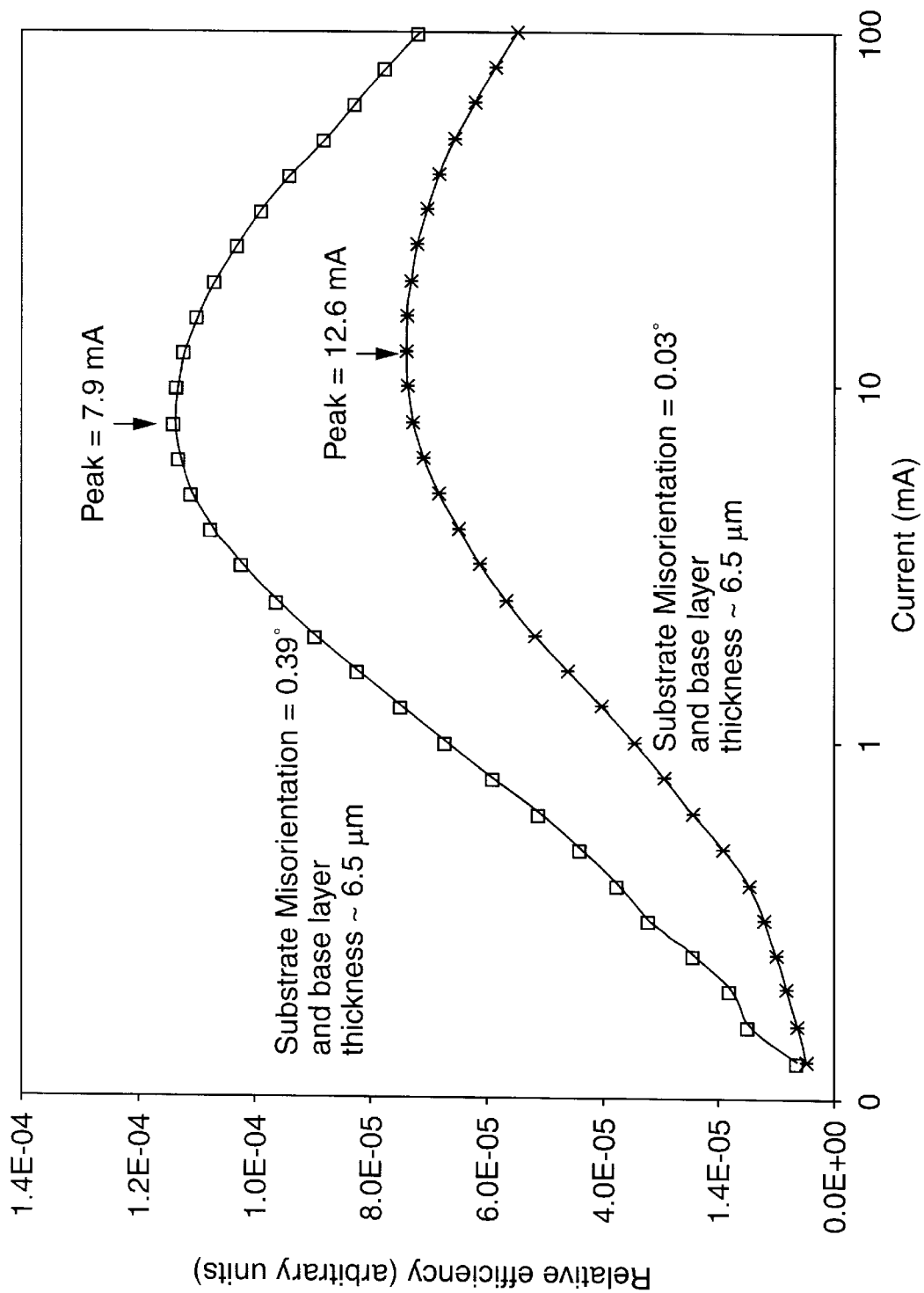
FIG. 7: Relative light emitting efficiency as a function of forward current for the thick base layer (6.5 µm) LED depicted in FIG. 5 grown on-axis (0.03°) and off-axis (0.39°).

FIG. 7 depicts the relative efficiency in producing light as a function of the forward current driving the LED. The data is not calibrated in terms of absolute light output (lumens) but rather compares the LED driving current with current generated by the particular photodetector employed to measure total light emitted. Thus, relative variations in light emitting efficiency from data point to data point and curve-to-curve may be extracted from FIG. 7.

The data of FIG. 7 relates to thick base layers as generally depicted in FIG. 5 (layer 3 approximately 6.5 $\mu$m), for two angles of misorientation from the c-axis towards the m-plane. The top curve is measured from a device grown on a substrate with a misalignment angle of approximately 0.39° and a base layer thickness of about 6.5 $\mu$m. The bottom curve is measured from a device grown on a on-axis substrate with a base layer thickness of about 6.5 $\mu$m. We see in FIG. 7 that for the two devices both having thick base layers of comparable thickness the off-axis deposition has a higher maximum in the efficiency curve than does on-axis deposition. Additionally, off-axis deposition is seen to peak at a lower current value than does on-axis deposition, 7.9 milliamp (mA) compared to 12.6 mA.

Achieving higher efficiency for off-axis deposition as depicted in FIG. 7 is certainly preferable, giving much brighter LEDs for the same current. However, achieving maximum efficiency at a lower current value is also evidence of a more favorable LED structure. Light emitting efficiency is determined, in part, by radiative electron-hole recombination and non-radiative loss mechanisms. Non-radiative losses tend to dominate the performance of the LED at lower currents. Higher currents tend to cause the non-radiative losses to saturate, leading to increasing light emitting efficiency at higher currents. Thus, peak efficiency at a lower current is evidence of fewer non-radiative loss mechanisms, indicating less defects and overall a better LED material.

Figure 8:
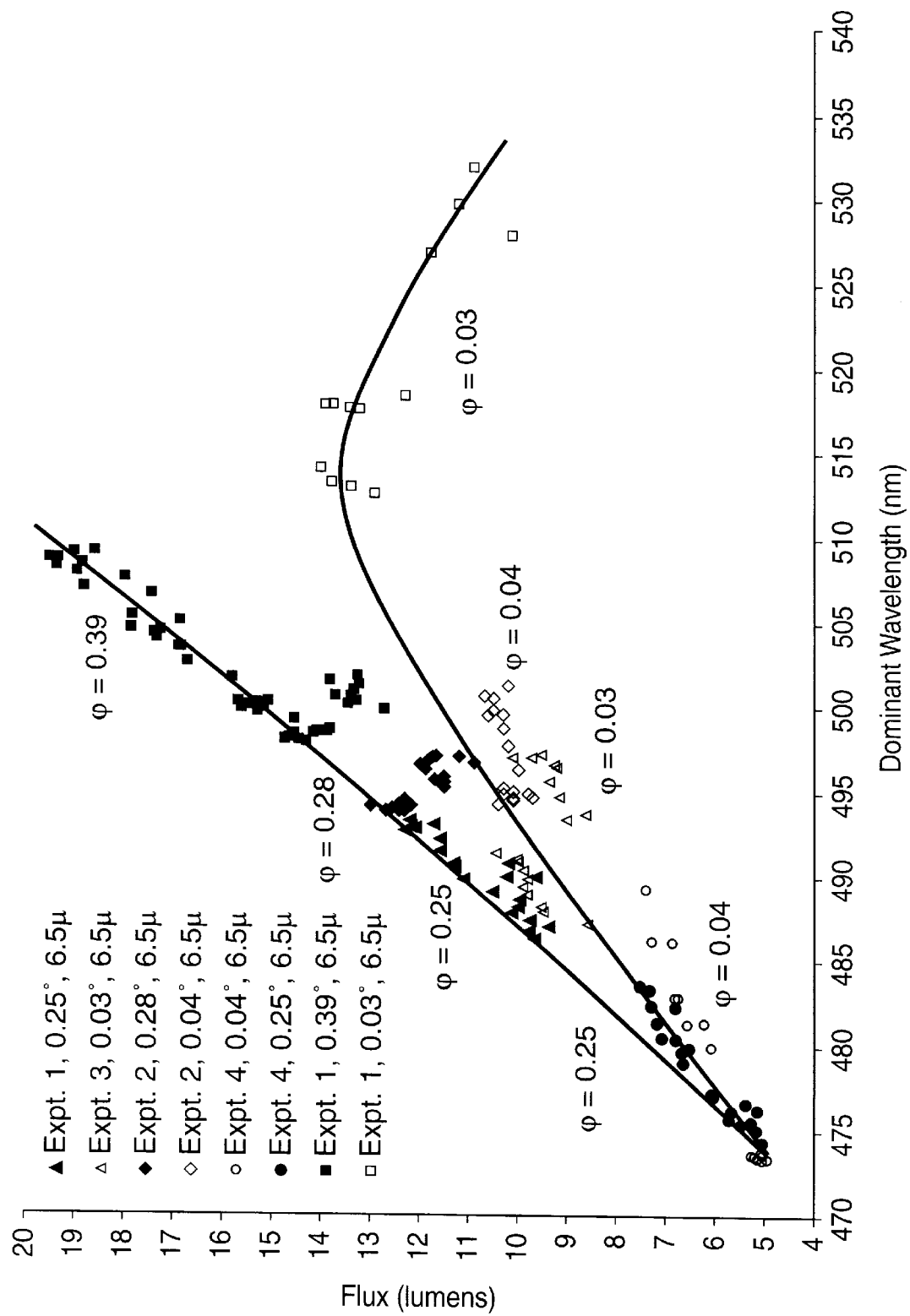
FIG. 8: Brightness as a function of dominant wavelength for four experiments of the same device structure grown with a thick base layer (6.5 µm) on substrates with and without misalignment.

FIG. 8 depicts four experiments in which on-axis and off-axis sapphire substrates were loaded into the same reactor and LEDs fabricated under otherwise identical conditions. All experiments depicted in FIG. 8 employ thick base layers approximately 6.5 $\mu$m thick. Thus, FIG. 8 allows a clear comparison of the effect on light emission of tilted vs. untilted substrates for thick base layers pursuant to the present invention, removing effects of other experiment-to-experiment variations. FIG. 8 clearly depicts the enhanced brightness resulting from the growth of thick base layers on tilted substrates.

Figure 9:
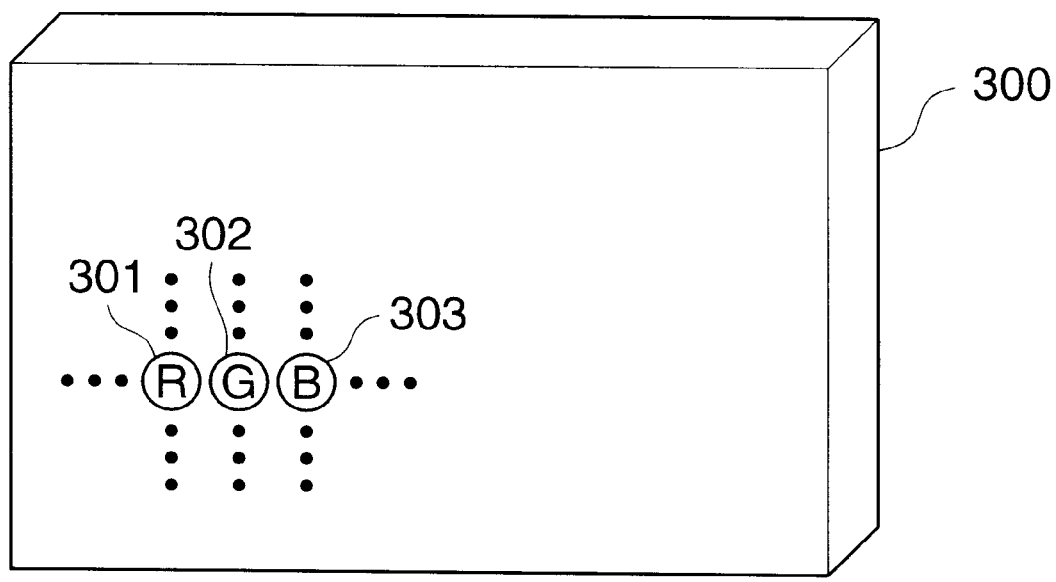
FIG. 9: Display device incorporating the high brightness LEDs of the present invention.
Figure 6:
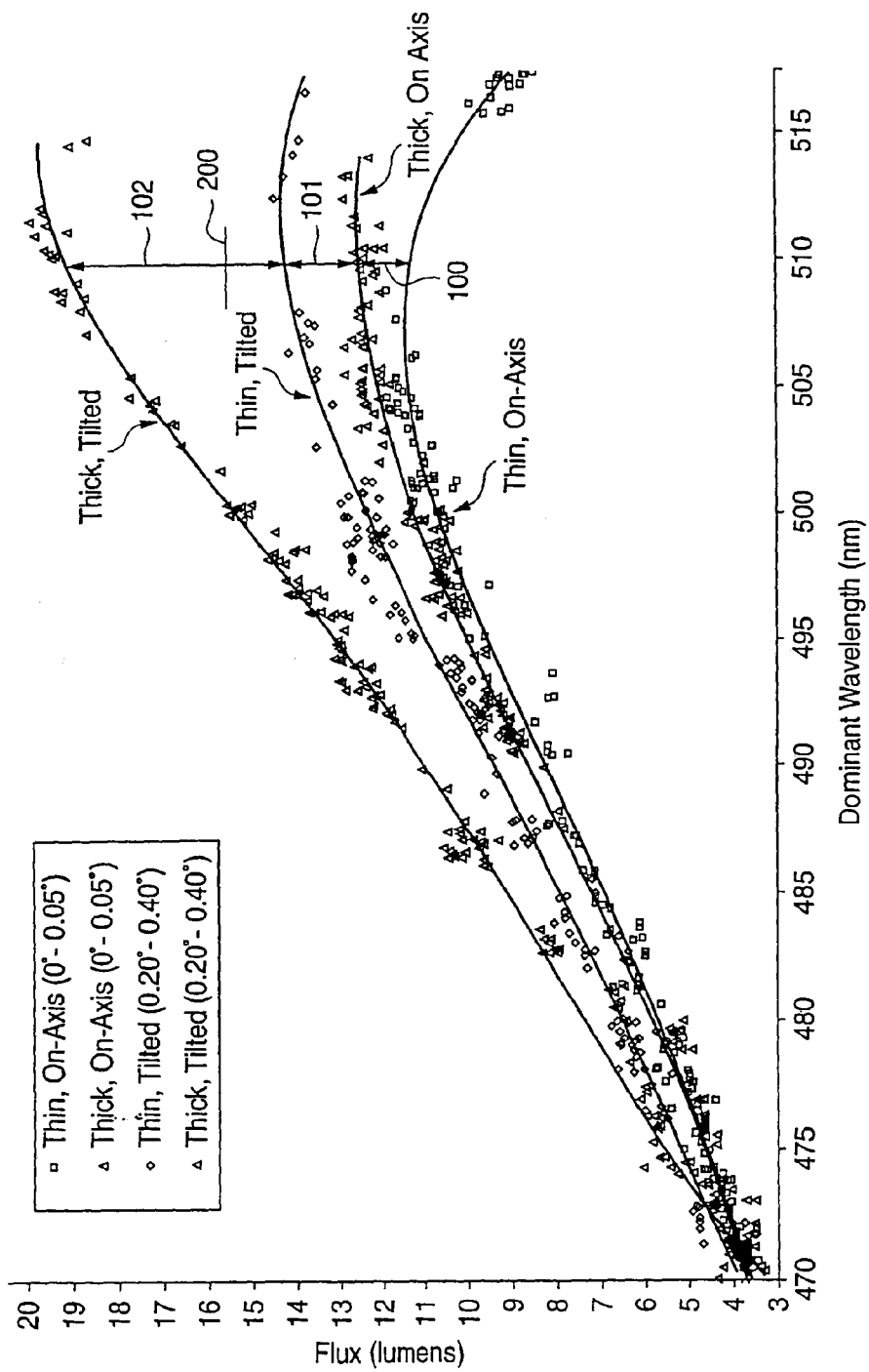

The resulting high brightness LEDs formed in accordance with the invention are particularly suitable for color display panels using red, green, and blue LEDs as the pixel elements. Such displays are well known and are represented in FIG. 9. A display panel 300 has an array of red, green, and blue LEDs, respectively, that are selectively illuminated by well known circuitry to display an image. Only three pixels are shown in FIG. 9 for simplicity. In one embodiment, each primary color is arranged in columns. In other embodiments, the primary colors are arranged in other patterns, such as triangles. The high brightness LEDs may also be used for backlighting an LCD display.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described.

We claim:

1. A light emitting structure comprising:
    a light emitting device comprising:
        a base layer having a thickness exceeding about 3.5 micrometers formed above a sapphire substrate having an upper face misaligned at an angle of at least 0.05° from a main crystal plane of the substrate; and
        a III-Nitride light emitting region formed above the base layer;
        wherein at least a portion of the base layer is doped with an n-type dopant.

2. A structure as in claim 1 wherein said misalignment angle is in the range from 0.05° to 10°.

3. A structure as in claim 1 wherein said misalignment angle is in the range from 0.05° to 5°.

4. A structure as in claim 1 wherein said misalignment angle is in the range from 0.05° to 1°.

5. A structure as in claim 1 wherein said thickness is from about 3.5 micrometers to about 200 micrometers.

6. A structure as in claim 1 wherein said thickness is from about 3.5 micrometers to about 20 micrometers.

7. A structure as in claim 1 wherein said thickness is from about 3.5 micrometers to about 10 micrometers.

8. A structure as in claim 1 wherein said thickness is from about 3.5 micrometers to about 7 micrometers.

9. A structure as in claim 1 wherein said thickness is from about 3.5 micrometers to a cracking limit.

10. A structure as in claim 1 wherein said thickness is sufficient to support said light emitting device upon removal of said substrate.

11. A structure as in claim 10 wherein the substrate is removed.

12. A structure as in claim 1 wherein said main crystal plane is the c-plane.

13. A structure as in claim 1 wherein the base layer has a doping level that increases in the direction towards the light-emitting region.

14. A structure as in claim 1 wherein the base layer has a doping level that decreases in the direction towards the light-emitting region.

15. A structure as in claim 1 wherein said base layer comprises a plurality of sublayers.

16. A structure as in claim 15 wherein said base layer comprises a first sublayer above said upper face of said substrate and a second sublayer above said first sublayer wherein said second sublayer is more heavily doped than said first sublayer.

17. A structure as in claim 16 wherein said first sublayer is lightly doped.

18. A structure as in claim 17 wherein said first sublayer comprises lightly doped gallium nitride.

19. A structure as in claim 18 wherein said second sublayer comprises n-type gallium nitride.

20. A structure as in claim 16 wherein the base layer further comprises a third sublayer above the second sublayer.

21. A structure as in claim 20 wherein the third sublayer is lightly doped.

22. A structure as in claim 19 wherein said second sublayer is doped with at least about $10^{18}$ dopant atoms per cubic centimeter.

23. A structure as in claim 1 comprising a display device, said display device comprising at least one blue light emitting device, at least one green light emitting device, and at least one red light emitting device, wherein at least one of the blue light emitting device, green light emitting device, and red light emitting device comprises:

a base layer having a thickness exceeding about 3.5 micrometers formed above a sapphire substrate having an upper face misaligned at an angle of at least 0.05° from a main crystal plane of the substrate; and a III-Nitride light emitting region formed above the base layer.

24. A structure as in claim 1 wherein said main crystal plane is the r-plane.

25. A light emitting structure comprising:

a light emitting device comprising:

a base layer having a thickness exceeding about 5.5 micrometers formed above a substrate having an upper face misaligned at an angle of at least 0.05° from a main crystal plane of the substrate; and a III-Nitride light emitting region formed above the base layer.

26. A structure as in claim 25 wherein the base layer has a thickness exceeding about 6.5 micrometers.

27. A structure as in claim 25 wherein said thickness is from about 6.5 micrometers to about 200 micrometers.

28. A structure as in claim 25 wherein said thickness is from about 6.5 micrometers to about 20 micrometers.

29. A structure as in claim 25 wherein said thickness is from about 6.5 micrometers to about 10 micrometers.

30. A structure as in claim 25 wherein said thickness is from about 6.5 micrometers to a cracking limit.

31. A structure as in claim 25 wherein said substrate is selected from the group consisting of sapphire, silicon carbide, gallium nitride, gallium arsenide, and gallium phosphide.

32. A structure as in claim 25 wherein said thickness is sufficient to support said light emitting device upon removal of said substrate.

33. A structure as in claim 25 wherein the substrate is removed.

\* \* \* \* \*

UNITED STATES PATENT AND TRADEMARK OFFICE
CERTIFICATE OF CORRECTION

PATENT NO. : 6,576,932 B2
DATED : June 10, 2003
INVENTOR(S) : Reena Khare, Werner K. Goetz and Michael D. Camras It is certified that error appears in the above-identified patent and that said Letters Patent is hereby corrected as shown below:

Drawings,
Sheet 6 of 9, replace with the attached corrected drawing.

Signed and Sealed this

Seventh Day of September, 2004

JON W. DUDAS
*Acting Director of the United States Patent and Trademark Office*